United States Patent
Kim et al.

(10) Patent No.: US 12,442,077 B2
(45) Date of Patent: Oct. 14, 2025

(54) SUBSTRATE PROCESSING APPARATUS

(71) Applicant: WONIK IPS CO., LTD., Pyeongtaek-si Gyeonggi-do (KR)

(72) Inventors: Tae Dong Kim, Osan-si Gyeonggi-do (KR); Jung Hwan Lee, Osan-si Gyeonggi-do (KR); Cheong Hwan Jeong, Anseong-si Gyeonggi-do (KR); Sung Ho Roh, Yongin-si Gyeonggi-do (KR); Young Jun Kim, Pyeongtaek-si Gyeonggi-do (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 462 days.

(21) Appl. No.: 17/901,521

(22) Filed: Sep. 1, 2022

(65) Prior Publication Data
US 2023/0073851 A1    Mar. 9, 2023

(30) Foreign Application Priority Data

Sep. 2, 2021 (KR) .......................... 10-2021-0117029

(51) Int. Cl.
| | | |
|---|---|---|
| C23C 16/455 | (2006.01) | |
| C23C 16/44 | (2006.01) | |
| C23C 16/458 | (2006.01) | |

(52) U.S. Cl.
CPC .... *C23C 16/45557* (2013.01); *C23C 16/4409* (2013.01); *C23C 16/4412* (2013.01);
(Continued)

(58) Field of Classification Search
CPC ......... C23C 16/45557; C23C 16/4409; C23C 16/4412; C23C 16/45517; C23C 16/45563; C23C 16/4585; C23C 16/4586
See application file for complete search history.

(56) References Cited

U.S. PATENT DOCUMENTS 6,030,457 A * 2/2000 Shimazu ............. C23C 16/4401
  118/733
6,557,237 B1 * 5/2003 Olgado ............. H01L 21/67028
  257/E21.175

(Continued)

FOREIGN PATENT DOCUMENTS

JP     2007250589 A  *  9/2007
JP     2011009299 A  *  1/2011
(Continued)

*Primary Examiner* — Jeffrie R Lund
(74) *Attorney, Agent, or Firm* — WILLIAM PARK AND ASSOCIATES LTD.

(57) ABSTRACT

The present invention relates to a substrate processing apparatus, and more particularly, to a substrate processing apparatus in which a substrate is processed at a high pressure and a low pressure. The substrate processing apparatus of the present invention includes: a process chamber (100) including a chamber body (110) which has an opened upper portion and in which an installation groove (130) is defined at a central side of a bottom surface (120) thereof, and a gate (111) configured to load/unload a substrate (1) is disposed at one side thereof, and a top lid (140) coupled to the upper portion of the chamber body (110) to define an inner space (S1); a substrate support (200) installed to be inserted into the installation groove (130) of the chamber body (110) and having a top surface on which the substrate (1) is seated.

11 Claims, 5 Drawing Sheets

(52) U.S. Cl.
CPC .. *C23C 16/45517* (2013.01); *C23C 16/45563* (2013.01); *C23C 16/4585* (2013.01); *C23C 16/4586* (2013.01)

(56) References Cited

U.S. PATENT DOCUMENTS

| | | | |
|---|---|---|---|
| 11,282,718 B2* | 3/2022 | Yoshida | H01L 21/67017 |
| 2009/0178620 A1* | 7/2009 | Juergensen | C23C 16/45565 |
| | | | 118/725 |
| 2011/0308464 A1* | 12/2011 | Kudoh | H01L 21/67017 |
| | | | 118/728 |
| 2013/0112680 A1 | 5/2013 | Moritz et al. | |
| 2016/0189987 A1* | 6/2016 | Amikura | H01L 21/67069 |
| | | | 156/345.29 |
| 2023/0070804 A1* | 3/2023 | Kim | C23C 16/45557 |
| 2023/0072156 A1* | 3/2023 | Roh | H01L 21/67017 |
| 2023/0073660 A1* | 3/2023 | Roh | H01L 21/67109 |
| 2023/0073851 A1* | 3/2023 | Kim | C23C 16/4585 |
| 2023/0084826 A1* | 3/2023 | Kim | H01L 21/68785 |
| | | | 206/710 |

FOREIGN PATENT DOCUMENTS

| | | |
|---|---|---|
| JP | 4787636 B2 * | 10/2011 |
| JP | 2021047335 A * | 3/2021 |
| KR | 1020030011399 A | 2/2003 |
| KR | 1020040082170 A | 9/2004 |
| KR | 1020210045294 A | 4/2021 |
| KR | 1020210081751 A | 7/2021 |
| KR | 102310823 B1 | 10/2021 |

* cited by examiner

SUBSTRATE PROCESSING APPARATUS

CROSS-REFERENCE TO RELATED APPLICATIONS

This U.S. non-provisional patent application claims priority under 35 U.S.C. § 119(a) to Korean Patent Application No. 10-2021-0117029, filed on Sep. 2, 2021, in the Korean Intellectual Property Office, the entire contents of which are hereby incorporated by reference.

FIELD OF THE INVENTION

The present invention disclosed herein relates to a substrate processing apparatus, and more particularly, to a substrate processing apparatus in which a substrate is processed at a high pressure and a low pressure.

BACKGROUND ART

The substrate processing apparatus may perform a process of processing a substrate such as a wafer, in general, perform etching, deposition, heat treatment, and the like on the substrate.

Here, when a film is formed on the substrate through the deposition, a process of removing impurities within the film and improving characteristics of the film after forming the thin film on the substrate is being required.

Particularly, as 3D semiconductor devices and substrates having a high aspect ratio appear, since a deposition temperature is lowered to meet a step coverage standard, or a gas having a high impurity content is inevitably used, the removing of the impurities within the film is becoming more difficult.

Accordingly, there is a need for a substrate processing method, which is capable of improving the characteristics of the thin film by removing the impurities existing in the thin film without deterioration in characteristics of the thin film after forming the thin film on the substrate, and an apparatus for processing the substrate, which performs the method.

In addition, there is a limitation that the deposited thin film is contaminated by a small amount of impurities, which remain in a chamber as well as the thin film on the substrate, and thus, it is necessary to remove the impurities from the inside of the chamber including a substrate support that supports the substrate.

To improve this limitation, Korean Patent Application No. 10-2021-0045294A, which is the related art, discloses a substrate processing method, in which high-pressure and low-pressure atmospheres are repeatedly formed to reduce imperfection on a surface of a substrate and the inside of a chamber, thereby improving characteristics of a thin film.

However, when the above-described substrate processing method is applied to the substrate processing apparatus according to the related art, since a volume of a processing space for processing a substrate is relatively large to cause a limitation that it is difficult to realize a fast pressure change rate.

In addition, the substrate processing apparatus according to the related art has a limitation in that it is difficult to implement a process of repeatedly performing a wide pressure range from a low pressure of about 0.01 Torrs to a high pressure of about 5 Bars within a short time.

In addition, the substrate processing apparatus according to the related art has a limitation in that it is difficult to perform high-pressure substrate processing and secure durability of a gate valve because the gate valve that seals the processing space does not withstand the pressure when performing the high-pressure substrate processing.

In addition, when the volume of the processing space in which the substrate is processed is reduced to repeatedly perform the wide pressure range within the short time, heat generated in the processing space is lost to the surrounding process chamber and the like, and thus, there are limitations in that it is difficult to maintain a process temperature, and a heater is deteriorated in efficiency.

SUMMARY OF THE INVENTION

To solve the above-mentioned limitations, an object of the present invention is to provide a substrate processing apparatus capable of improving a pressure change rate in a wide pressure range.

In accordance with an embodiment of the present invention, a substrate processing apparatus includes: a process chamber 100 including a chamber body 110 which has an opened upper portion and in which an installation groove 130 is defined at a central side of a bottom surface 120 thereof, and a gate 111 configured to load/unload a substrate 1 is disposed at one side thereof, and a top lid 140 coupled to the upper portion of the chamber body 110 to define an inner space S1; a substrate support 200 installed to be inserted into the installation groove 130 of the chamber body 110 and having a top surface on which the substrate 1 is seated; an inner lid part 300 which is installed to be vertically movable in the inner space S1 and of which a portion is in close contact with the bottom surface 120 adjacent to the installation groove 130 through descending to define a sealed processing space S2 in which the substrate support 200 is disposed; a gas supply part 400 installed to communicate with the processing space S2 and configured to supply a process gas to the processing space S2; an inner lid driving part 600 installed to pass through the top lid 140 to drive the vertical movement of the inner lid part 300; and a filling member 700 installed between the substrate support 200 and an inner surface of the installation groove 130 to occupy at least a portion of a space between the substrate support 200 and the inner surface of the installation groove 130.

The filling member 700 may be provided in a shape corresponding to an interspace between the installation groove 130 and the substrate support 200 so that the processing space S2 is minimized.

The substrate support 200 may include: a substrate support plate 210 on which the substrate 1 is seated on a top surface thereof and a substrate support post 220 passing through a bottom surface of the process chamber 100 so as to be connected to the substrate support plate 210, wherein the filling member 700 may be installed to be adjacent to a side surface and a bottom surface of the substrate support plate 210.

The filling member 700 may be installed to be spaced apart from the substrate support plate 210 so as to surround the side surface and the bottom surface of the substrate support plate 210.

The substrate support 200 may be installed to be spaced apart from the filling member 700.

The filling member 700 may be made of at least one of quartz, ceramic, or SUS.

The filling member 700 may include: an insulating part 710 configured to block heat from the processing space S2 to the outside; and a reflection part 720 provided on a surface of the insulating part 710 to reflect heat.

The reflection part 720 may be applied on the surface of the insulating part 710.

The substrate processing apparatus may further include: a plurality of substrate support pins 810 passing through the filling member 700 and the substrate support 200 to move vertically, thereby supporting the substrate 1; and an annular substrate support ring 820 which is elevated through an external substrate support driving pin 830 and on which the plurality of substrate support pins 810 are installed, wherein the process chamber 100 may further include a support pin installation groove 160 defined in a bottom surface so that the substrate support ring 820 is installed.

The substrate processing apparatus may further include: a plurality of substrate support pins 810 passing through the substrate support 200 to move vertically, thereby supporting the substrate 1; and an annular substrate support ring 820 which is elevated through an external substrate support driving pin 830 and on which the plurality of substrate support pins 810 are installed, wherein the filling member 700 may further include a support pin installation groove 160 defined so that the substrate support ring 820 is installed.

BRIEF DESCRIPTION OF THE DRAWINGS

The accompanying drawings are included to provide a further understanding of the present invention, and are incorporated in and constitute a part of this specification.

The drawings illustrate exemplary embodiments of the present invention and, together with the description, serve to explain principles of the present invention. In the drawings.

DETAILED DESCRIPTION OF THE PREFERRED EMBODIMENTS

Hereinafter, a substrate processing apparatus according to the present invention will be described with reference to the accompanying drawings.

Figure 1:
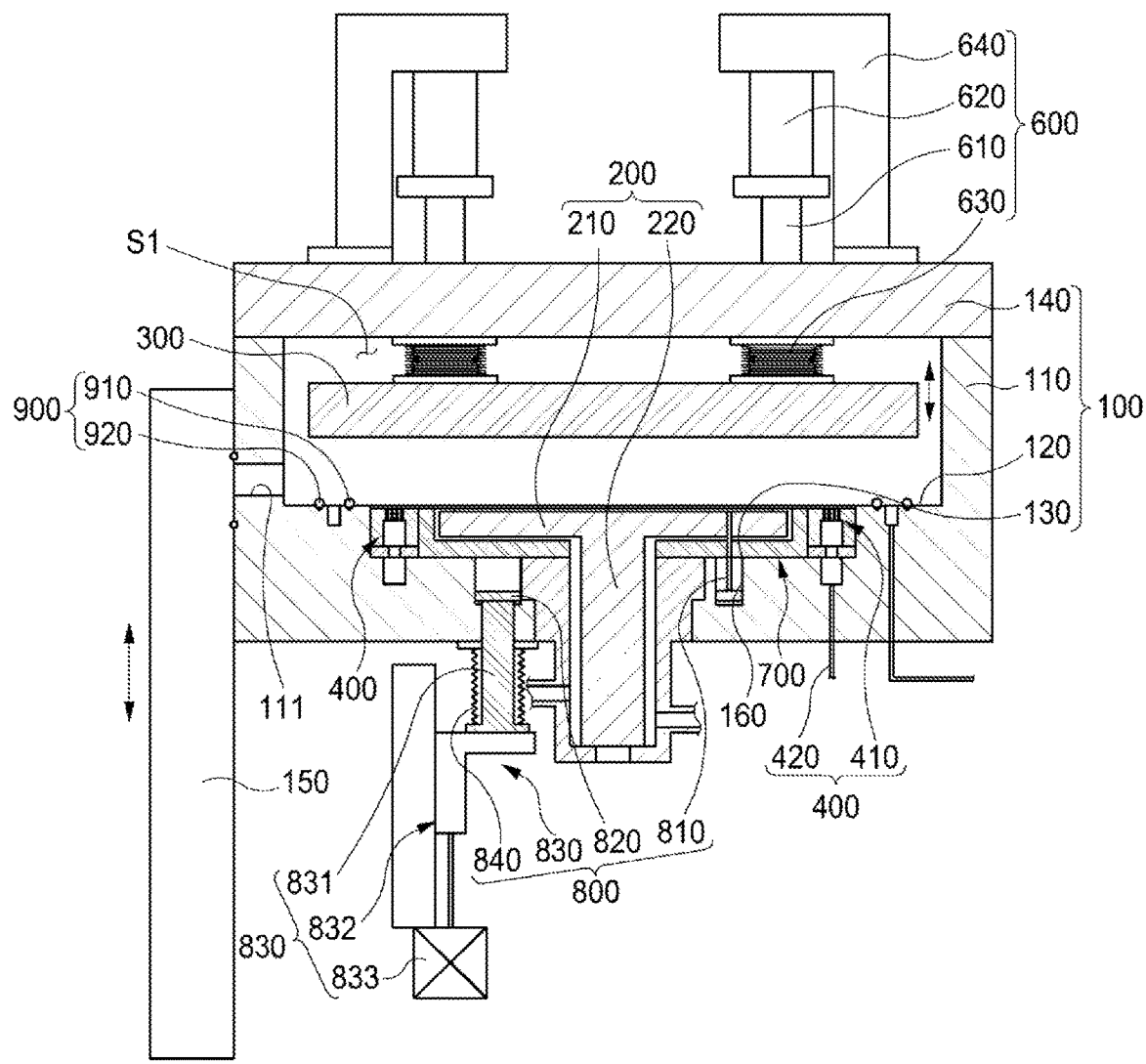
FIG. 1 is a cross-sectional view illustrating a substrate processing apparatus according to the present invention.

As illustrated in FIG. 1, a substrate processing apparatus according to the present invention includes a process chamber 100 including a chamber body 110 Which has an opened upper portion and in which an installation groove 130 is defined at a central side of a bottom surface 120 thereof, and a gate 111 for loading/unloading a substrate 1 is disposed at one side thereof and a top lid 140 coupled to the upper portion of the chamber body 110 to define an inner space S1, a substrate support 200 installed to be inserted into the installation groove 130 of the chamber body 110 and having a top surface on which the substrate 1 is seated, an inner lid part 300 which is installed to be vertically movable in the inner space S1 and of which a portion is in close contact with the bottom surface 120 adjacent to the installation groove 130 through descending to define a sealed processing space S2 in which the substrate support 200 is disposed, a gas supply part 400 installed to communicate with the processing space S2 and configured to supply a process gas to the processing space S2, an inner lid driving part 600 installed to pass through the top lid 140 to drive the vertical movement of the inner lid part 300, and a filling member 700 installed between the substrate support 200 and an inner surface of the installation groove 130 to occupy at least a portion of a space between the substrate support 200 and the inner surface of the installation groove 130.

In addition, the substrate processing apparatus according to the present invention may further include a substrate support pin part 800 configured to support the substrate 1 loaded into and unloaded from the process chamber 100 and seated on the substrate support 200.

In addition, the substrate processing apparatus according to the present invention may further include a pumping part 500 installed to be in close contact with the inner lid part 300 in the process chamber 100 to pump a gas leaking into the sealing part 900.

Here, the substrate 1 to be processed may be understood to include all substrates such as substrates used in display devices such as LCD, LED, and OLED, semiconductor substrates, solar cell substrates, glass substrates, and the like.

The process chamber 100 may have a configuration in which the inner space S1 is defined therein and thus may have various configurations.

For example, the process chamber 100 may include the chamber body 110 having the opened upper portion and the top lid 140 covering the opened upper portion of the chamber body 110 to define the sealed inner space S1 together with the chamber body 110.

In addition, the process chamber 100 may include the bottom surface 120 defining the bottom of the inner space S1 and the installation groove 130 defined in the bottom surface 120 to install the substrate support 200.

In addition, the process chamber 100 may further include a gate valve 150 for opening and closing a gate 111 provided at one side of the chamber body 110 to load and unload the substrate 1.

In addition, the process chamber 100 may further include a support pin installation groove 160 defined in a bottom surface of the substrate support 200 to be described later to install a substrate support ring 820.

The chamber body 110 may have an opened upper portion to define the sealed inner space S1 together with the top lid 140 to be described later.

Here, the chamber body 110 may be made of a metal material including aluminum. As another example, the chamber body 110 may be made of a quartz, material and may have a rectangular parallelepiped shape like the chamber that is disclosed in the related art.

The top lid 140 may be coupled to the upper side of the chamber body 110 having the opened upper portion and may be configured to define the sealed inner space S1 together with the chamber body 110.

Here, the top lid 140 may be provided in a rectangular shape on a plane to correspond to the shape of the chamber body 110 and may be made of the same material as the chamber body 110.

In addition, the top lid 140 may have a plurality of through-holes so that the inner lid driving part 600 to be described later is installed to pass therethrough, and an end of a bellows 630 to be described later may be coupled to the top lid 140 to prevent various gases and foreign substances from leaking.

The configuration of the top lid 140 may be omitted, and the chamber body 110 may be integrally provided to define the sealed inner space S1 therein.

The process chamber 100 may include the bottom surface 120, of which an inner bottom surface defines the bottom of the inner space S1, and the installation groove 130 defined to install the substrate support 200.

More specifically, as illustrated in FIG. 1, in the process chamber 100, the installation groove 130 may be defined with a height difference at a central side of the bottom surface to correspond to the substrate support 200 to be described later, and the bottom surface 120 may be defined on an edge of the installation groove 130.

That is, in the process chamber 100, the installation groove 130 for installing the substrate support 200 may be defined with the height difference in the inner bottom surface, and the other portion may be defined as the bottom surface 120 at a height higher than the installation groove 130.

The gate valve 150 may have a configuration for opening and closing the gate 111 disposed at one side of the chamber body 110 to load and unload the substrate 1 and may have various configurations.

Here, the gate valve 150 may be in close contact with or released from the chamber body 110 through vertical driving and forward/backward driving to open or close the gate 111. For another example, the gate valve 150 may open or close the gate 111 through single driving in a diagonal direction. In this process, various types of driving methods disclosed in the related art, such as a cylinder, a can, an electromagnetism, and the like may be applied.

The support pin installation groove 160 may have a configuration for installing the substrate support 200 that supports the substrate 1 and is seated on the substrate support 200 or spaced upward from the substrate support 200 to support the substrate 1 to load or unload the substrate 1 and may have various configurations.

For example, the support pin installation groove 160 may be provided as a planar annular groove corresponding to the substrate support ring 820 so that a substrate support ring 820 to be described later is installed.

Here, the support pin installation groove 160 may be installed to correspond to a position at which the substrate support ring 820 is installed on the bottom surface of the process chamber 100, and more specifically, may be defined in the installation groove 130.

That is, the support pin installation groove 160 may be defined in the installation groove 130 defined with the height difference from the bottom surface 120 and may have a predetermined depth so that the substrate support ring 820 is movable vertically in the installed state.

Thus, in the support pin installation groove 160, the substrate support ring 820 may be installed so that a plurality of substrate support pins 810 are installed to pass through the filling member 700 and the substrate support plate 210 upward.

Since the support pin installation groove 160 is defined in the installation groove 130 to define a predetermined volume, the volume of the processing space S2 defined by the inner lid part 300 to be described later may increase.

To solve this limitation, the filling member 700 may be installed in the installation groove 130 to cover the support pin installation groove 160, thereby blocking a space defined by the processing space S2 and the support pin installation groove 160. As a result, the processing space S2 may be defined in minimum volume.

More specifically, if there is no support pin installation groove 160, since a space for the substrate support pin 810 and the substrate support ring 820 to be described later is separately required under the substrate support plate 210, an increase of a dead volume may occur. Thus, to remove the dead volume, the support pin installation groove 160 may be defined so that the substrate support pin 810 and the substrate support ring 820 are inserted therein when descending.

Unlike this, the support pin installation groove 160 may not be installed in the bottom surface 120 of the process chamber 100, but may be defined in the filling member 700 installed in the installation groove 130.

That is, the support pin installation groove 160 may be defined to a predetermined depth in the top surface of the filling member 700, more specifically, to a depth at which the substrate support ring 820 and the substrate support pin 810 are inserted and thus may ascend to support the substrate 1 in a state of being inserted into the filling member 700.

Here, the substrate support pin 810 may be installed to pass through the filling member 700.

The substrate support 200 may have a configuration that is installed in the process chamber 100 so that the substrate 1 is seated on a top surface thereof and may have various configurations.

That is, the substrate support 200 may support the substrate 1 to be processed by seating the substrate 1 on the top surface thereof and may be fixed during the substrate processing process.

In addition, the substrate support 200 may include a heater therein to provide a temperature atmosphere in the processing space S2 for the substrate processing.

For example, the substrate support 200 may include a substrate support plate 210 having a planar circular shape on which the substrate 1 is seated on a top surface thereof, and a substrate support post 220 passing through the bottom surface of the process chamber 100 so as to be connected to the substrate support plate 210.

In addition, the substrate support 200 may include a heater installed in the substrate support plate 210 to heat the substrate 1 seated on the substrate support plate 210.

The substrate support plate 210 may have a configuration in which the substrate 1 is seated on the top surface thereof and may be provided as a plate having a planar circular shape corresponding to the shape of the substrate 1.

Here, the substrate support plate 210 may be provided with a heater therein to create a process temperature for the substrate processing in the processing space S2. Here, the process temperature may be about 400° C. to 550° C.

The substrate support post 220 may have a configuration that passes through the bottom surface of the process chamber 100 so as to be connected to the substrate support plate 210 and may have various configurations.

The substrate support post 220 may pass through the bottom surface of the process chamber 100 so as to be coupled to the substrate support plate 210, and various conductors for supplying power to the heater may be installed in the substrate support post 220.

Figure 5:
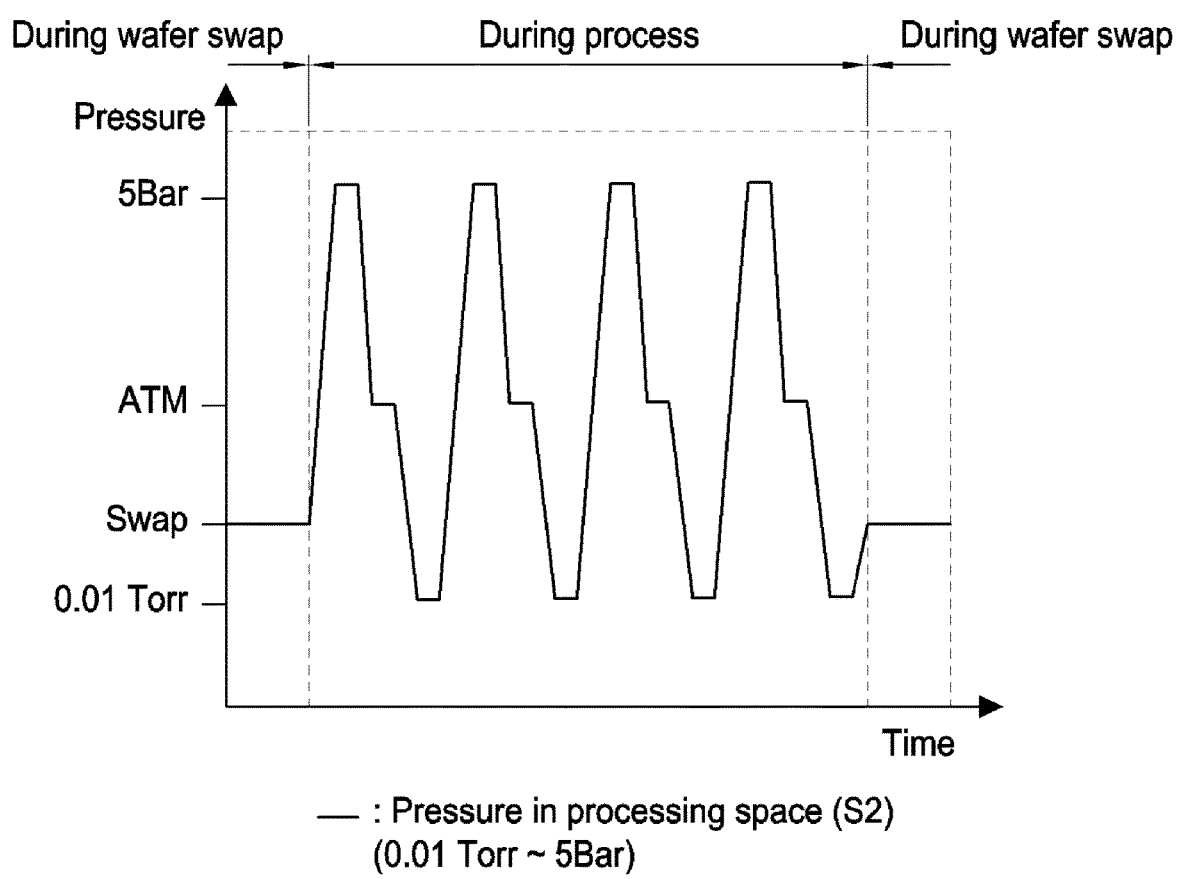
FIG. 5 is a graph illustrating a change in pressure according to a process through the substrate processing apparatus of FIG. 1.

As illustrated in FIG. 5, the substrate processing apparatus according to the present invention may be an apparatus for performing the substrate processing in which a high-pressure and low-pressure atmosphere is repeatedly changed and created within a short time, and more particularly, it is necessary to repeatedly change a pressure range of about 0.01 Torrs at a pressure change rate of about 1 Bar/s.

However, when considering a vast space volume of the inner space S1 of the chamber body 110, the above-described pressure change rate may not be achieved, and thus, there is a need to minimize the volume of the processing space S2 for the substrate processing.

For this, the substrate processing apparatus according to the present invention includes an inner lid part 300 which is installed to be vertically movable in the inner space S1 and of which a portion is in close contact with the process chamber 100 through descending to define the sealed processing space S2, in which the substrate support 200 is disposed.

The inner lid part 300 may have a configuration which is installed to be vertically movable in the inner space S1 and of which a portion is in close contact with the process chamber 100 through the descending to define the sealed processing space S2, in which the substrate support 200 is disposed.

That is, the inner lid part 300 may be installed to be vertically movable at an upper side of the substrate support 200 in the inner space S1 so as to be in close contact with at least a portion of the inner surface of the process chamber 110 through the is descending, and thus, the sealed processing space S may be defined between the inner lid part 300 and the inner bottom surface of the process chamber 100 as necessary.

Thus, the substrate support 200 may be disposed in the processing space S2 to perform the substrate processing on the substrate 1 seated on the substrate support 200 in the processing space S2 having the minimized volume.

For example, an edge of the inner lid part 300 may be in close contact with the bottom surface 120 through the descending to define the sealed processing space S2 between the bottom surface and the inner bottom surface of the process chamber 100.

For another example, the edge of the inner lid part 300 may be in close contact with the inner surface of the process chamber 100 through the descending to define the sealed processing space S2.

The edge of the inner lid part 300 may be in close contact with the bottom surface 120 through the descending to define the sealed processing space S2, and the substrate support 200 installed in the installation groove 130 may be disposed within the processing space S2.

Figure 2:
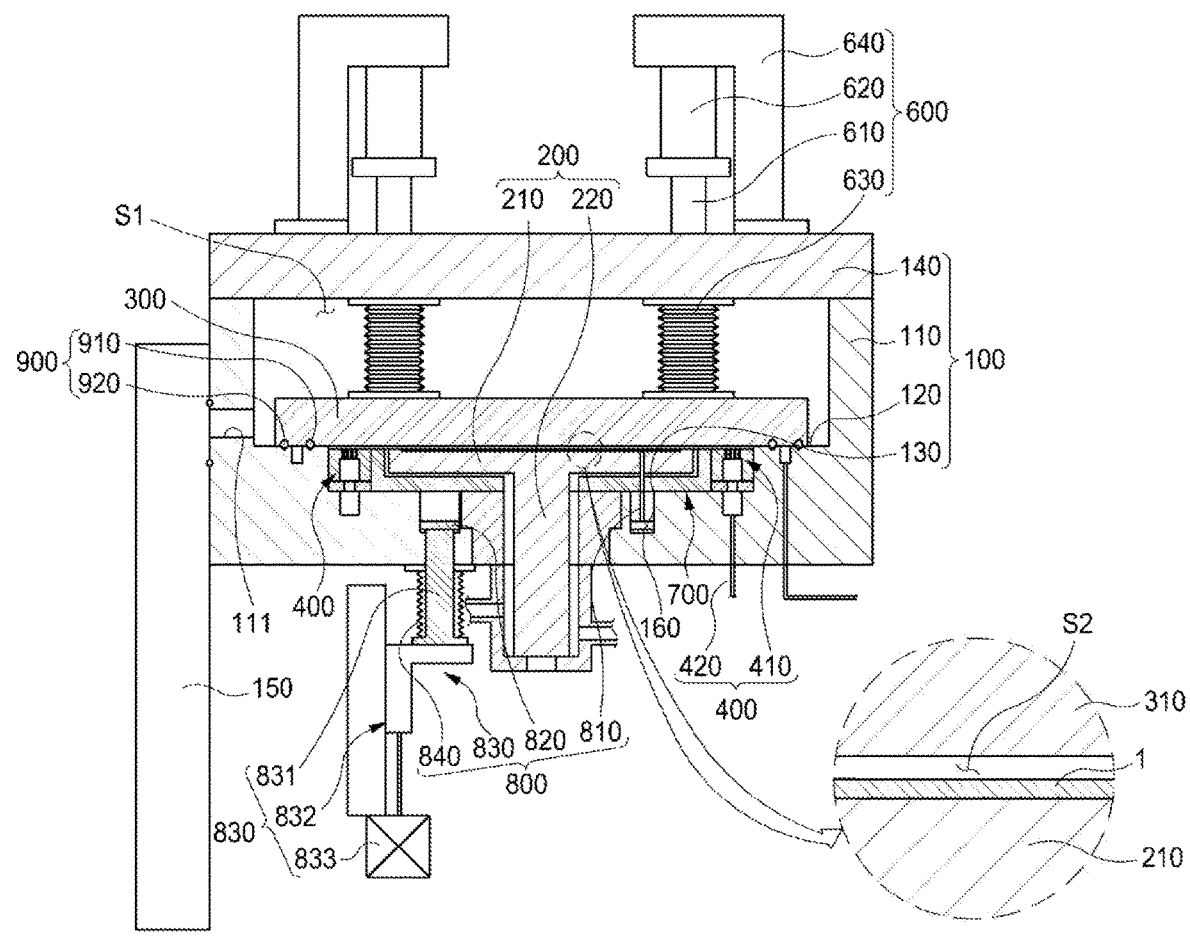
FIG. 2 is a cross-sectional view illustrating a processing space of the substrate processing apparatus of FIG. 1.
Figure 3:
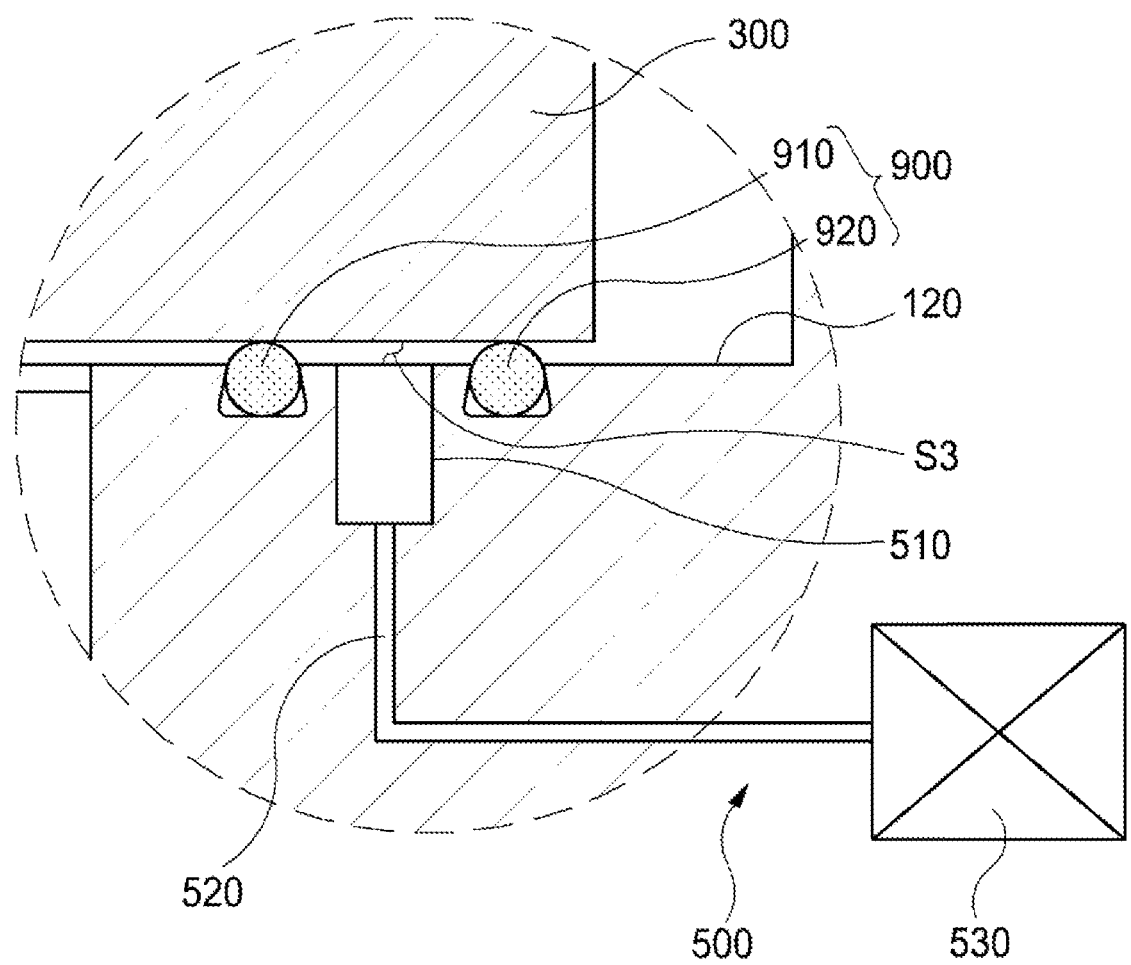
FIG. 3 is an enlarged view illustrating a portion A that shows a sealing part of the substrate processing apparatus of FIG. 1.

That is, as illustrated in FIG. 2, the edge of the inner lid part 300 may be in close contact with the bottom surface 120 disposed at a high position with a height difference with respect to the installation groove through the descending to define the sealed processing space S2 between the bottom surface and the installation groove 130.

Here, the substrate support 200, more specifically, the substrate support plate 210 and the filling member 700 may be installed in the installation groove 130 to minimize the volume of the processing space S2 and dispose the substrate 1 to be processed on the top surface thereof.

In this process, to minimize the volume of the processing space S2, the installation groove 130 may have a shape corresponding to the substrate support 200 installed in the processing space S2, more particularly, may be provided as a groove having a cylindrical shape corresponding to the circular substrate support plate 210.

That is, the installation groove 130 may have a shape corresponding to that of the substrate support plate 210 so that a remaining space except for the space, in which the substrate support plate 210 and the filling member 700 are installed, in the installation space, in which the installation groove 130 is defined, is minimized.

In this process, to prevent an interference between the substrate 1 seated on the top surface of the substrate support plate 210 and the inner lid part 300 from occurring, the bottom surface 120 may be disposed at a height higher than that of the top surface of the substrate 1 seated on the substrate support 200.

It means that, as a distance between the substrate 1 seated on the substrate support 200 and the bottom surface of the inner lid part 300 increases, the processing space S2 increases also in volume. Thus, the height of the bottom surface 120 may be set at a position at which the distance is minimized while preventing the interference between the substrate 1 and the inner lid part 300 from occurring.

The inner lid part 300 may have a configuration that moves vertically through the inner lid driving part 600 and may have various configurations.

The inner lid part 300 may have a configuration that is vertically movable in the inner space S1 through the inner lid driving part 600.

Here, the inner lid part 300 may cover the installation groove 130 on a plane, and the edge of the inner lid part 300 may have a size corresponding to a portion of the bottom surface 120. In addition, the edge may be in close contact with the bottom surface 120 to define the sealed processing space S2 between the installation groove 130 and the inner lid part 300.

For another example, the edge of the inner lid part 300 may be in close contact with the inner surface of the process chamber 100 to define the processing space S2.

In addition, to effectively achieve and maintain the process temperature in the sealed processing space S2 defined according to the vertical movement, the inner lid part 300 may be made of a material having an excellent thermal insulation effect that is capable of preventing the temperature of the processing space S2 from being lost to the inner space S1.

The sealing part 900 may have a configuration provided on at least one of the inner lid part 300 or the bottom surface 120 of the process chamber 100 and may be provided to correspond to a position at which the bottom surface 120 of the processing chamber 100 and the inner lid part 300 are in close contact with each other.

That is, when the edge of the inner lid part 300 is in close contact with the bottom surface 120 to define the sealed processing space S2, the sealing part 900 may be provided along an edge of the bottom surface of the inner lid part 300 so as to be in contact with the bottom surface 120.

Thus, the sealing part 900 may induce the formation of the sealed processing space S2 and prevent a process gas of the processing space S2 from leaking to the outside of the inner space S1.

For example, the sealing part 900 may include a first sealing member 910 provided along the edge of the bottom surface of the inner lid part 300 and a second sealing member 920 provided at a position spaced a predetermined distance from the first sealing member 910.

Here, each of the first sealing member 910 and the second sealing member 920 may be an O-ring according to the related art, and the first sealing member 910 and the second sealing member 920 may be installed to be spaced a predetermined distance from each other along the edge of the bottom surface of the inner lid part 300.

That is, the first sealing member 910 and the second sealing member 920 may perform double sealing on the processing space S2 to prevent the process gas from leaking from the processing space S2 to the outside.

The sealing part 900 may be installed by being inserted into an insertion groove provided in the bottom surface 120 and may be in close contact with or separated from the inner lid part 300 according to the vertical movement of the inner lid part 300.

For another example, the sealing part 900 may also be provided on the bottom surface of the inner lid part 300.

The pumping part 500 may have a configuration which is installed at a position that is in close contact with the inner lid part 300 of the process chamber 100 to pump the process gas leaking to the sealing part 900 and may have various configurations.

For example, the pumping part 500 may be installed to pass through the bottom surface of the process chamber 100 at a position corresponding to the close contact position between the inner lid part 300 and the process chamber 100 to pump the sealing part 900 installed on the inner led part 300.

That is, the pumping part 500 may minimize exposure of the process gas to the sealing part 900, which is a consumable, to minimize corrosion and damage of the sealing part 900 exposed to the processing space S2, in which a high temperature is generated, and the process gas is used, thereby improving durability.

For this, the pumping part 500 may pump an interspace S3 between the first sealing member 910 and the second sealing member 920.

For example, the pumping part 500 may include a pump 530 provided at the side to pump the interspace S3, a pumping nozzle 510 installed at a position corresponding between the first sealing member 910 and the sealing member 920, and a pumping passage 520 provided to pass through the bottom surface of the process chamber 100 so that one end thereof communicates with the pumping nozzle 510, and the other end thereof is connected to the external pump 530.

Here, the pumping nozzle 510 may be provided in a planar circular shape along the sealing part 900. For another example, the pumping nozzle 510 may be provided at a portion of the groove defined in the bottom surface of the process chamber 100 along the sealing part 900 to perform the pumping along the groove.

The pumping passage 520 may be a separate pipe configuration provided to pass through the bottom surface of the process chamber 100. For another example, the pumping passage 520 may be provided by processing the bottom surface of the process chamber 100.

Unlike the above-described example of pumping the process gas leaking into the sealing part 900, the pumping part 500 may have a configuration that supplies a purge gas into the interspace S3 between the first sealing member 910 and the second sealing member 920.

The gas supply part 400 may communicate with the processing space S2 to supply the process gas to the processing space S2 and may have various configurations.

For example, the gas supply part 400 may include a gas supply nozzle 410 exposed to the processing space S2 to supply the process gas into the processing space S2 and a gas supply passage 420 passing through the process chamber 100 so as to be connected to the gas supply nozzle 410 and transfer the process gas supplied through the gas supply nozzle 410.

Here, as illustrated in FIG. 2, the gas supply part 400 may be installed to be adjacent to the substrate support 200 on the edge of the installation groove 130 to supply the process gas to the processing space S2.

The processing space S2 may be defined between a portion of the bottom surface of the inner lid part 300 and the top surfaces of the gas supply part 400 and the substrate support 200.

The gas supply nozzle 410 may have a configuration that is exposed to the processing space S2 to supply the process gas into the processing space S2 and may have various configurations.

For example, the gas supply nozzle 410 may be installed to be adjacent to a side surface of the substrate support plate 210 on the edge of the installation groove 130 and may inject the process gas upward or toward the substrate support plate 210 to supply the process gas into the processing space S2.

Here, the gas supply nozzle 410 may be provided to surround the substrate support plate 210 on the edge of the installation groove 130 and may inject the process gas from at least a portion of the side surface of the substrate support plate 210 on the plane.

For example, the gas supply nozzle 410 may inject the process gas from the edge of the installation groove 130 toward the bottom surface of the inner lid part 300 and may supply the process gas to generate a desired pressure within a short time in the processing space S2 according to the minimized volume of the processing space S2.

The gas supply passage 420 may pass through the bottom surface of the process chamber 100 so as to be connected to an external process gas storage part and may receive the process gas to supply the process gas to the process gas supply nozzle 410.

Here, the gas supply passage 420 may be a pipe installed to pass through the bottom surface of the process chamber 100. For another example, the gas supply passage 420 may be provided by processing the bottom surface of the process chamber 100.

The inner lid driving part 600 may be installed to pass through the top surface of the process chamber 100 so as to drive the vertical movement of the inner lid part 300 and may have various configurations.

For example, the inner lid driving part 600 may include a plurality of driving rods 610, each of which one end passes through the top surface of the process chamber 100 and is coupled to the inner lid part 300, and at least one driving source 620 connected to the other end of each of the plurality of driving rods 610 to drive the driving rods 610 vertically.

In addition, the inner lid driving part 600 may further include a fixing support 630 installed on the top surface of the process chamber 100, i.e., the top lid 140 to fix and support the end of the driving rod 610 and a bellows 630 installed to surround the driving rod 610 between the top surface of the process chamber 100 and the inner lid part 300.

The driving rod 610 may have a configuration having one end passing through the top surface of the process chamber 100 so as to be coupled to the inner lid part 300 and the other end coupled to the driving source 620 outside the process chamber 100 to drive the inner lid part 300 vertically through the vertical movement due to the driving source 620.

Here, the driving rod 610 may be provided in plurality, more particularly, two or four to be coupled to the top surface of the inner lid part 300 at a predetermined interval so that the inner lid part 300 moves vertically while being maintained horizontally.

The driving source 620 may have a configuration that vertically drives the driving rod 610 installed and coupled to the fixing support 640 and may have various configurations.

The driving source 620 may be applied to any configuration as long as it is driving method that is disclosed in the related art, for example, various driving methods such as a cylinder method, an electromagnetic driving, screw motor driving, cam driving, and the like may be applied.

The bellows 630 may have a configuration that is installed to surround the driving rod 610 between the top surface of the process chamber 100 and the inner lid part 300 to prevent the gas in the inner space S1 from leaking thought the top surface of the process chamber 100.

Here, the bellows 630 may be installed in consideration of the vertical movement of the inner lid part 300.

As described above, when the substrate support 200 is installed in the installation groove 130, a space may be defined between the substrate support 200, more particularly, the substrate support plate 210 and the installation groove 130 to act as a factor that increases in volume of the processing space S2.

To solve this limitation, when the substrate support 200 is installed to be in contact with the installation groove 130, heat supplied through the heater existing in the substrate support 200 may be lost to the process chamber 100 through the bottom surface of the process chamber 100, i.e., the installation groove 130 to cause a heat loss. As a result, it may be difficult to set and maintain the process temperature with respect to the processing space S2, and efficiency may be deteriorated.

To solve this limitation, the filling member 700 according to the present invention may have a configuration that is installed between the substrate support 200 and the bottom surface of the process chamber 100, and may have various configurations.

For example, the filling member 700 may be installed in the installation groove 130, and in the state of being installed in the insulation groove 130, the substrate support plate 210 may be installed at the upper side to minimize a remaining volume between the installation groove 130 and the substrate support plate 210, thereby reducing the volume of the processing space S2.

For this, the filling member 700 may be provided in a shape corresponding to the interspace between the installation groove 130 and the substrate support 200 so that the processing space S2 is minimized.

More specifically, the filling member 700 may have a planar circular shape and may be provided in shape corresponding to the interspace between the installation groove 130, which is defined to have a predetermined depth from the bottom surface 120 with the height difference, and the substrate support plate 210.

Figure 4:
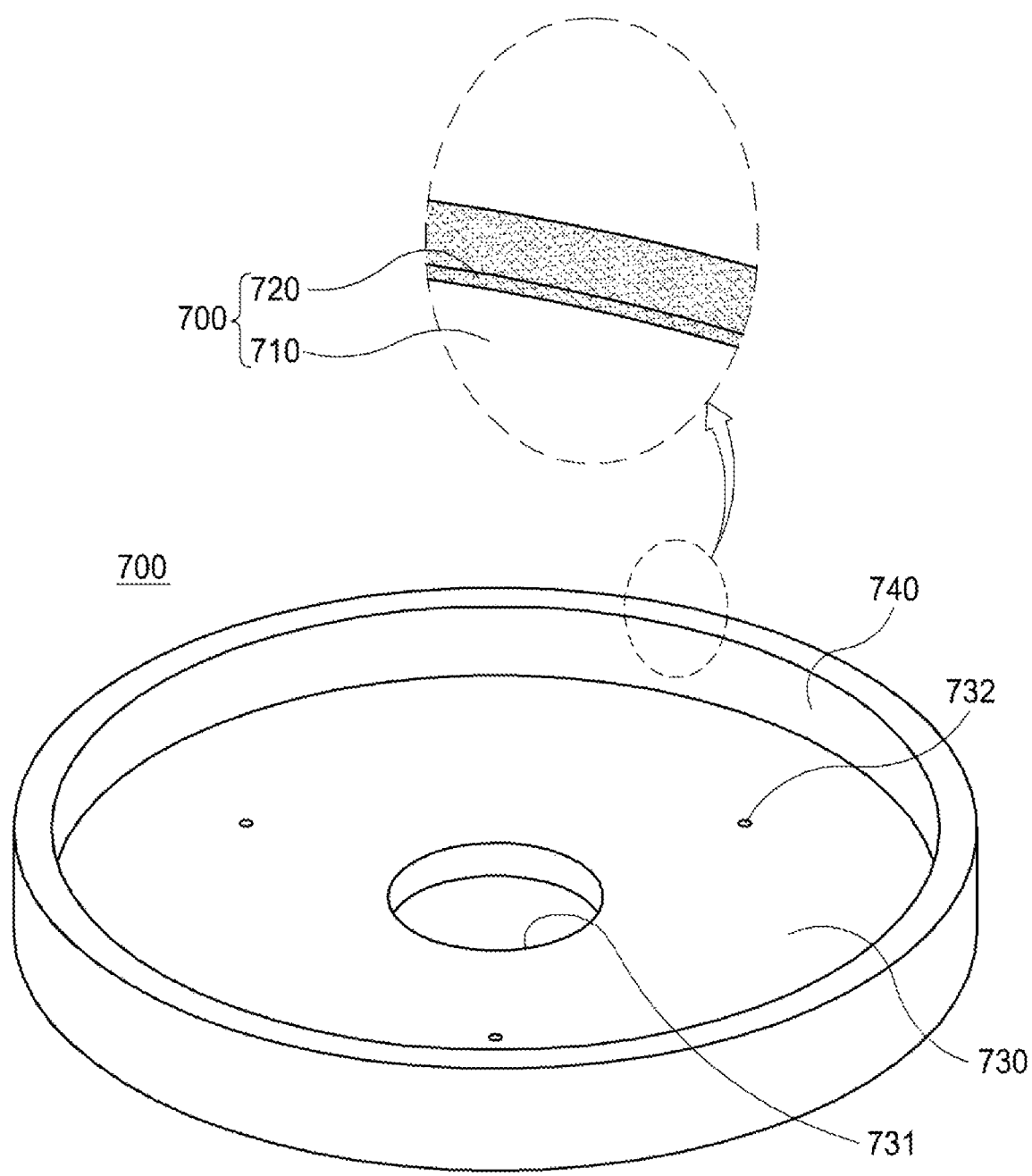
FIG. 4 is a perspective view illustrating a filling member of the substrate processing apparatus of FIG. 1.

For this, as illustrated in FIG. 4, the filling member 700 may have a shape of the circular plate 730 provided between the substrate support plate 210 and the installation groove 130 or may have an edge that is provided with an upwardly stepped portion 740 to occupy the interspace between the side surface of the substrate support plate 210 and the installation groove 130 in the shape of the circular plate 730.

That is, the filling member 700 may be installed to be adjacent to at least one of the side surface or the bottom surface of the substrate support plate 210 and may be spaced apart from the substrate support plate 210 to surround the bottom surface and the side surface of the substrate support plate 210.

Here, to prevent the heat from being lost through the filling member 700, the substrate support 200 may be installed to be spaced apart from the filling member 700, and in more detail, the substrate support 200 may be installed with a degree of a fine gap by which the substrate support 200 is not contact with the filling member 700.

As a result, a predetermined distance may be maintained between the substrate support 200 and the filling member 700, and the gap may act as an exhaust passage, and thus, exhaust with respect to the processing space S2 may be performed.

More specifically, the substrate support 200 and the filling member 700 may be installed to be spaced apart from each other to define the exhaust passage. Here, the exhaust passage may communicate with the bottom of the installation groove 130, through which the substrate support post 220 passes, to exhaust the process gas within the processing space S2 to the outside.

The filling member 700 may be made of at least one of quartz, ceramic, or SUS.

In addition, the filling member 700 may not only simply occupy the space between the installation groove 130 and the substrate support 200 to minimize the volume of the processing space S2, but also minimize the loss of the heat transferred to the substrate 1 through the substrate support 200 through thermal insulation and furthermore reflect the heat that is lost to the processing space S2 through thermal reflection.

That is, the filling member 700 may not only minimize the volume of the processing space S2, but also insulate for preventing the heat from being lost through the substrate support 200 to the bottom surface 120 of the process chamber 100, furthermore, perform a reflection function to be improved in thermal efficiency through the reflection of heat.

In addition, to improve the reflection effect of the heat emitted through the substrate support 200 to the processing space S2, a reflection part 720 provided on the surface of the substrate support 200 may be additionally provided.

That is, the filling member 700 may include an insulating part 710 for blocking heat from the processing space S2 to the outside and a reflection part 720 provided on a surface of the insulating part 710 to reflect heat.

Here, the reflection part 720 may be coated, adhered, or applied on the surface of the heat insulating part 710 to provide a reflection layer and may reflect heat lost from the processing space S2 through the process chamber 100 so as to be transferred again to the processing space S2.

In addition, the filling member 700 may further include a first through-hole 731 having a size corresponding to a center so that the foregoing substrate support post 220 is installed and a plurality of second through-holes 732 passing through the plurality of substrate support pins 810 to move vertically.

The substrate support pin part 800 may have a configuration that supports the substrate 1 loaded into or unloaded from the process chamber 100 and is seated on the substrate support 200 and may have various configurations.

For example, the substrate support pin part 800 may include a plurality of substrate support pins 810 passing through the filling member 700 and the substrate support 200 to move vertically, thereby supporting the substrate 1, an annular substrate support ring 820 on which the plurality of substrate support pins 810 are installed, and a substrate support pin driving part 830 that drive the plurality of substrate support pins 810 vertically.

The plurality of substrate support pins 810 may have a configuration that is provided in plurality on the substrate support ring 820 to pass through the filling member 700 and the substrate support 200 so as to move vertically, thereby supporting the substrate 1 and may have various configurations.

Here, the plurality of substrate support pins 810 may be provided in at least three and may be installed to be spaced apart from each other on the substrate support ring 820. Also, the plurality of substrate support pins 810 may ascend to be exposed from the substrate support 200, thereby supporting the substrate 1 that is loaded or may descend to be disposed inside the substrate support 200, thereby seating the substrate 1 on the substrate support 200.

The substrate support ring 820 may have an annular configuration on which the plurality of substrate support pins 820 are installed so that the plurality of substrate support pins 820 move vertically at the same time through the vertical movement.

Particularly, the substrate support ring 820 may be installed in a support pin installation groove 160 defined in the bottom surface of the process chamber 100, that is, the installation groove 130 to move vertically by a substrate support pin driving part 830.

The substrate support pin driving part 830 may have a configuration that is installed outside the process chamber 100 to drive the substrate support ring 820 vertically, and may have various configurations.

For example, the substrate support pin driving part 830 may include a substrate support pin rod 831 that has one end connected to the bottom surface of the substrate support ring 820 and the other end connected to a substrate support pin driving source 833 to move vertically according to driving force of the substrate support pin driving source 833, and a substrate support guide 832 configured to guide linear movement of the substrate support pin rod 831 and a substrate support pin driving source 833 configured to drive the substrate support pin rod 831.

In addition, the substrate support pin part 800 may further include a substrate support bellows 840 that surrounds the substrate support pin rod 831 and is installed between the bottom surface of the process chamber 100 and the substrate support pin driving source 833.

The substrate processing apparatus according to the present invention may have the advantage of improving the pressure change rate in the wide pressure range by minimizing the volume of the pressing space in which the substrate inside the chamber is processed.

Particularly, the substrate processing apparatus according to the present invention may have the advantage that the pressure is changed at the high pressure change rate of about 1 Bar/s from the low pressure of about 0.01 Torrs to the high pressure of about 5 Bars.

In addition, the substrate processing apparatus according to the present invention may have the advantage that the substrate processing is performed by forming the sealed processing space through the descending adhesion of the inner lid part irrespective of the gate valve even when processing the substrate through the high-pressure process to facilitate the performing of the substrate processing in the high-pressure process and prevent the gate vale from being damaged.

In addition, the substrate processing apparatus according to the present invention may have the advantage of preventing the leakage to the outside of the apparatus through the pumping in the inner space due to the formation of the double space even when the risk occurs from the processing space during the substrate processing according to the high-pressure process.

In addition, the substrate processing apparatus according to the present invention may have the advantage of minimizing the loss of the heat provided through the heater for the substrate processing to the surrounding components including the process chamber to facilitate the reaching to the process temperature and the maintenance of the process temperature without the heat loss while maintaining the processing space having the minimized volume.

Particularly, the substrate processing apparatus according to the present invention may have the advantage in that the heating efficiency of the heater is improved by reflecting the heat provided from the heater again to the processing space or preventing the heat loss to the surrounding structure.

In addition, the substrate processing apparatus according to the present invention may have the advantage of minimizing the volume of the processing space by forming the processing space separately while securing the space in which the substrate support pin for loading and unloading the substrate is installed.

Although the above description merely corresponds to some exemplary embodiments that may be implemented by the present invention, as well known, the scope of the present invention should not be interpreted as being limited to the above-described embodiments, and all technical spirits having the same basis as that of the above-described technical spirit of the present invention are included in the scope of the present invention.

What is claimed is:

1. A substrate processing apparatus comprising:
a process chamber comprising a chamber body which has an opened upper portion and in which an installation groove is defined at a central side of a bottom surface thereof, and a gate configured to load/unload a substrate is disposed at one side thereof, and a top lid coupled to the upper portion of the chamber body to define an inner space;
a substrate support installed to be inserted into the installation groove of the chamber body and having a top surface on which the substrate is seated;
an inner lid part which is installed to be vertically movable in the inner space and of which a portion is in close contact with the bottom surface adjacent to the installation groove through descending to define a sealed processing space in which the substrate support is disposed;
a gas supply part installed to communicate with the processing space and configured to supply a process gas to the processing space;
an inner lid driving part installed to pass through the top lid to drive the vertical movement of the inner lid part; and
a filling member installed between the substrate support and an inner surface of the installation groove to occupy at least a portion of a space between the substrate support and the inner surface of the installation groove.

2. The substrate processing apparatus of claim 1, wherein the filling member is provided in a shape corresponding to an interspace between the installation groove and the substrate support so that the processing space is minimized.

3. The substrate processing apparatus of claim 1, wherein the substrate support comprises:
a substrate support plate on which the substrate is seated on the top surface thereof; and
a substrate support post passing through a bottom surface of the process chamber so as to be connected to the substrate support plate,
wherein the filling member is installed to be adjacent to a side surface and a bottom surface of the substrate support plate.

4. The substrate processing apparatus of claim 3, wherein the filling member is installed to be spaced apart from the substrate support plate so as to surround the side surface and the bottom surface of the substrate support plate.

5. The substrate processing apparatus of claim 1, wherein the substrate support is installed to be spaced apart from the filling member.

6. The substrate processing apparatus of claim 1, wherein the filling member is made of at least one of quartz, ceramic, or SUS.

7. The substrate processing apparatus of claim 1, wherein the filling member comprises:
- an insulating part configured to block heat from the processing space to the outside; and
- a reflection part provided on a surface of the insulating part to reflect heat.

8. The substrate processing apparatus of claim 7, wherein the reflection part is applied on the surface of the insulating part.

9. The substrate processing apparatus of claim 1, further comprising:
- a plurality of substrate support pins passing through the filling member and the substrate support to move vertically, thereby supporting the substrate; and
- an annular substrate support ring which is elevated through an external substrate support driving pin and on which the plurality of substrate support pins are installed,
- wherein the process chamber further comprises a support pin installation groove defined in a bottom surface so that the substrate support ring is installed.

10. The substrate processing apparatus of claim 9, wherein the substrate support pin installation groove is defined in the installation groove and covered by the filling member.

11. The substrate processing apparatus of claim 1, further comprising:
- a plurality of substrate support pins passing through the substrate support to move vertically, thereby supporting the substrate; and
- an annular substrate support ring which is elevated through an external substrate support driving pin and on which the plurality of substrate support pins are installed,
- wherein the filling member further comprises a support pin installation groove defined so that the substrate support ring is installed.

* * * * *